(12) United States Patent
Lee

(10) Patent No.: US 7,868,366 B2
(45) Date of Patent: Jan. 11, 2011

(54) IMAGE SENSOR AND METHOD FOR FABRICATING THE SAME

(75) Inventor: Min Hyung Lee, Seoul (KR)

(73) Assignee: Dongbu Hitek Co., Ltd., Seoul (KR)

( * ) Notice: Subject to any disclaimer, the term of this patent is extended or adjusted under 35 U.S.C. 154(b) by 392 days.

(21) Appl. No.: 12/048,634

(22) Filed: Mar. 14, 2008

(65) Prior Publication Data
US 2008/0224246 A1 Sep. 18, 2008

(30) Foreign Application Priority Data
Mar. 14, 2007 (KR) ...................... 10-2007-0024914

(51) Int. Cl.
*H01L 33/00* (2010.01)
*H01L 21/00* (2010.01)
(52) U.S. Cl. ............... 257/292; 257/294; 257/E27.133; 257/E27.134; 438/67; 438/70; 438/75
(58) Field of Classification Search ................ 257/291, 257/292, 294, E27.133, E27.134; 438/66, 438/67, 70, 75
See application file for complete search history.

(56) References Cited

FOREIGN PATENT DOCUMENTS

JP          20020001936        7/2003
KR       10-2004-0115928     7/2006

*Primary Examiner*—Minh-Loan T Tran
(74) *Attorney, Agent, or Firm*—Saliwanchik, Lloyd & Saliwanchik

(57) ABSTRACT

An image sensor is disclosed including a second semiconductor substrate including a metal interconnection and a second interlayer dielectric; a second via penetrating the second interlayer dielectric so that the second via is connected to the metal interconnection; a first semiconductor substrate on the second interlayer dielectric, the first semiconductor substrate having a unit pixel; a pre-metal dielectric on the first semiconductor substrate; a first via penetrating the pre-metal dielectric and the first semiconductor substrate, the first via being electrically connected to the second via; a first interlayer dielectric on the pre-metal dielectric including the first via; a metal interconnection on the first interlayer dielectric and connected to the first via and the unit pixel; a conductive barrier layer on the metal interconnection; and a color filter and a microlens on the first interlayer dielectric in each unit pixel.

20 Claims, 4 Drawing Sheets

IMAGE SENSOR AND METHOD FOR FABRICATING THE SAME

CROSS-REFERENCE TO RELATED APPLICATION

The present application claims the benefit under 35 U.S.C. §119 of Korean Patent Application No. 10-2007-0024914, filed Mar. 14, 2007, which is hereby incorporated by reference in its entirety.

BACKGROUND

Image sensors are semiconductor devices that convert an optical image into an electric signal. Image sensors may be classified into charge coupled device (CCD) image sensors and complementary metal oxide silicon (CMOS) image sensors (CIS).

A CMOS image sensor includes photodiodes and MOS transistors in unit pixels and implements an image by sequentially detecting electric signals of the unit pixels using a switching method.

As CMOS image sensors with mega pixels have been recently developed, the pixel size becomes relatively smaller. Due to the reduction in the pixel size, a focus length of a microlens is also reduced. Therefore, a metal interconnection of a peripheral logic circuit surrounding a pixel tends to be limited.

BRIEF SUMMARY

Embodiments provide an image sensor, which is capable of enhancing an optical characteristic of a photodiode, and a method for fabricating the same.

In one embodiment, an image sensor includes: a second semiconductor substrate including a metal interconnection and a second interlayer dielectric; a second via penetrating the second interlayer dielectric so that the second via is connected to the metal interconnection; a first semiconductor substrate on the second interlayer dielectric, the first semiconductor substrate having a unit pixel; a pre-metal dielectric (PMD) on the first semiconductor substrate; a first via penetrating the pre-metal dielectric and the first semiconductor substrate to electrically connect with the second via; a first interlayer dielectric on the pre-metal dielectric including the first via; a metal interconnection on the first interlayer dielectric connected to the first via and the unit pixel; a conductive barrier layer on the metal interconnection; and a color filter and a microlens on the first interlayer dielectric for each unit pixel.

In another embodiment, a method for fabricating an image sensor includes: forming a pre-metal dielectric (PMD) on a first semiconductor substrate including a unit pixel; forming a first via penetrating the pre-metal dielectric and the first semiconductor substrate in a region corresponding to a non unit-pixel region; forming a first interlayer dielectric on the first semiconductor substrate including the first via; forming a metal interconnection on the first interlayer dielectric so that the metal interconnection is connected to the unit pixel and the first via; forming a conductive barrier layer on only the metal interconnection; forming a color filter and a microlens on the first interlayer dielectric for each unit pixel; preparing a second semiconductor substrate including a metal interconnection and a second interlayer dielectric; forming a second via penetrating the second interlayer dielectric so that the second via is connected to the metal interconnection of the second semiconductor substrate; and bonding the first via of the first semiconductor substrate with the second via of the second semiconductor substrate.

The details of one or more embodiments are set forth in the accompanying drawings and the description below. Other features will be apparent from the description and drawings, and from the claims.

DETAILED DESCRIPTION

Reference will now be made in detail to the embodiments of the present disclosure, examples of which are illustrated in the accompanying drawings. When the terms "on" or "over" are used herein, when referring to layers, regions, patterns, or structures, it is understood that the layer, region, pattern or structure can be directly on another layer or structure, or intervening layers, regions, patterns, or structures may also be present. When the terms "under" or "below" are used herein, when referring to layers, regions, patterns, or structures, it is understood that the layer, region, pattern or structure can be directly under the other layer or structure, or intervening layers, regions, patterns, or structures may also be present.

An image sensor and a method for fabricating the same according to embodiments will be described in detail with reference to the accompanying drawings.

Figure 8:
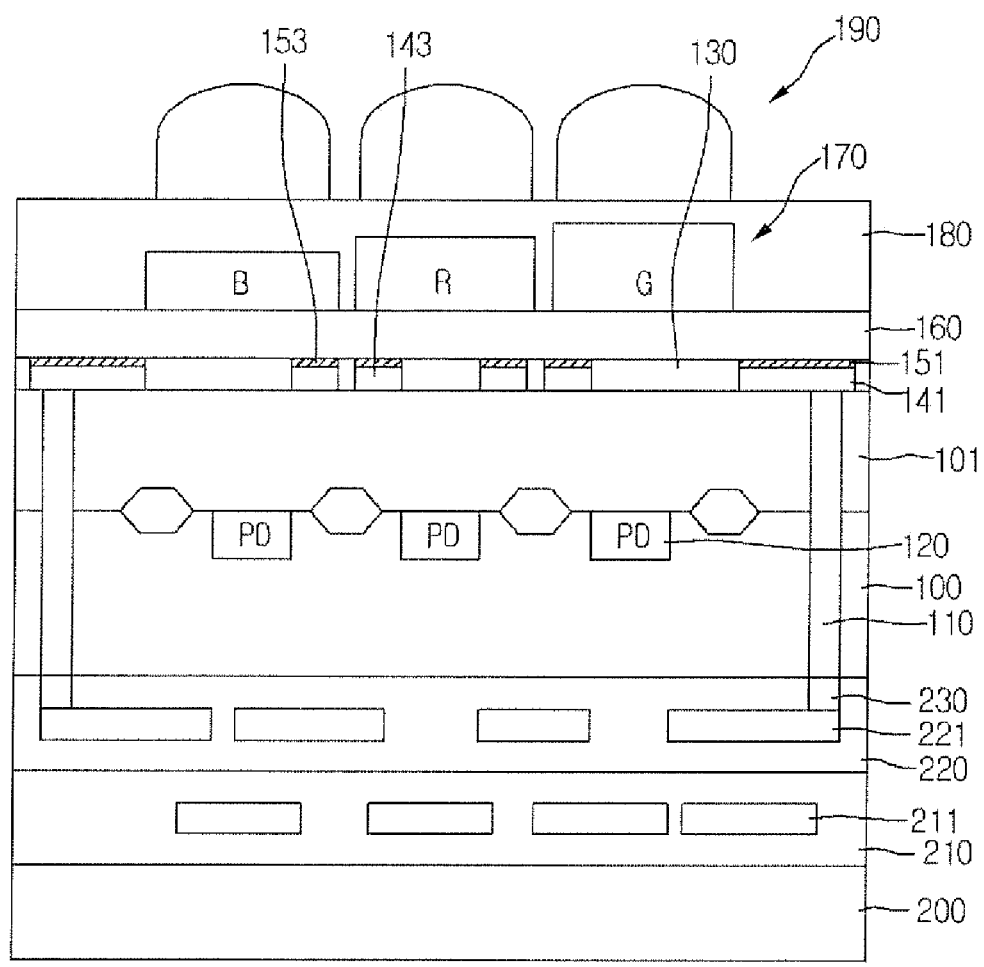

FIG. 8 is a cross-sectional view of an image sensor according to an embodiment.

Referring to FIG. 8, a first via 110 is defined in a first semiconductor substrate 100, and a first interlayer dielectric 130 can be disposed on the first semiconductor substrate 100.

The first via 110 can be formed to penetrate through both the first semiconductor substrate 100 and a pre-metal dielectric (PMD) 101 formed on the first semiconductor substrate 100. That is, the first via 110 can be exposed at the bottom surface of the first semiconductor substrate 100.

First and second metal interconnections 141 and 143 can be disposed on the first interlayer dielectric 130. The first metal interconnection 141 can be connected to the first via 110. The second metal interconnection 143 can be connected to a contact (not shown), which is connected to a pixel region.

The first and second metal interconnections 141 and 143 can be formed having a top surface lower than the top surface of the first interlayer dielectric 130, such that the first and second metal interconnections 141 and 143 and the first interlayer dielectric 130 have a height difference. Conductive barrier layers 151 and 153 can be disposed on the first and second metal interconnections 141 and 143, respectively. In one embodiment, the conductive barrier layer on the corresponding metal interconnection can be provided making up the height difference between the metal interconnection and the first interlayer dielectric.

According to an embodiment, the first and second metal interconnections 141 and 143 can be formed of copper (Cu). The conductive barrier layers 151 and 153 can be formed of cobalt (Co) or nickel (Ni) alloy.

A passivation layer 160, a color filter array 170, a planarization layer 180, and a microlens 190 can be additionally provided on the first interlayer dielectric 130.

A second semiconductor substrate 200 is disposed under the first semiconductor substrate 100. A second via 230 can be exposed on the second semiconductor substrate 200. The second via 230 is disposed under the first via 110 and can be electrically connected to the first via 110.

That is, the first semiconductor substrate 100 and the second semiconductor substrate 200 can be electrically connected together through the first via 110 and the second via 230.

The first semiconductor substrate 100 can be, for example, a monocrystalline silicon substrate or a polycrystalline silicon substrate. The second semiconductor substrate 200 can be, for example, a monocrystalline silicon substrate or a polycrystalline silicon substrate.

A second interlayer dielectric 210 including a plurality of metal interconnections 211 can be provided on the second semiconductor substrate 200. A third interlayer dielectric 220 including a plurality of metal interconnections 221 can be provided on the second interlayer dielectric 210.

Although not shown, the metal interconnections 211 of the second interlayer dielectric 210 can be electrically connected to the metal interconnections 221 of the third interlayer dielectric 220.

In addition, the second via 230 can be formed on any one of the metal interconnections 221 of the third interlayer dielectric 220. In one embodiment, the second via 230 can penetrate the third interlayer dielectric 220 and be exposed. Furthermore, the second via 230 is provided at a location corresponding to the first via 110 of the first semiconductor substrate 100.

Since the second via 230 exposed in the top surface of the second semiconductor substrate 200 is disposed under the first via 110 exposed in the bottom surface of the first semiconductor substrate 100, the first semiconductor substrate 100 and the second semiconductor substrate 200 are electrically connected to each other.

A method for fabricating an image sensor according to an embodiment will be described below with reference to FIGS. 1 to 8.

Figure 1:
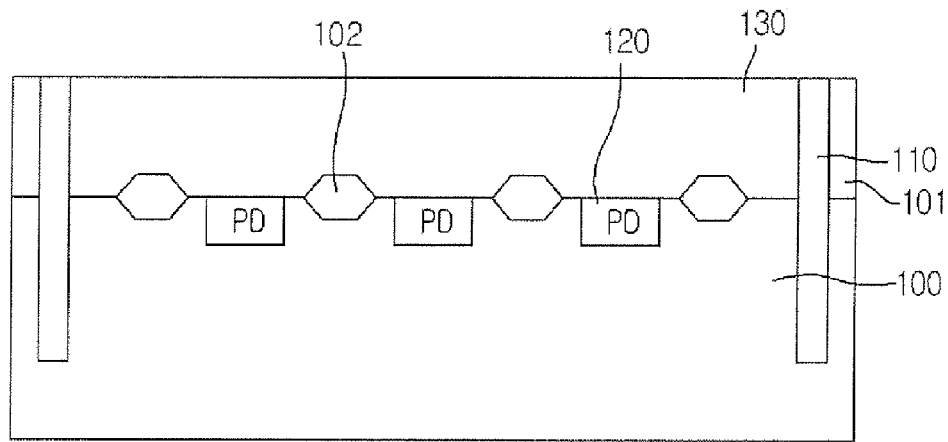
FIGS. 1 to 8 are cross-sectional views illustrating a method for fabricating an image sensor according to an embodiment.

Referring to FIG. 1, a photodiode 120 can be formed in a first semiconductor substrate 100 for each pixel.

According to an embodiment, a device isolation layer (including isolation layers 102) defining an active region and a field region can be formed in the first semiconductor substrate 100. Then, a unit pixel including the photodiode 120 can be formed in the active region. A transistor (not shown) connected to the photodiode 120 can also be formed for each unit pixel to process photoelectric charges.

A pre-metal dielectric (PMD) 101 can be formed on the first semiconductor substrate 100 having the photodiode 120. After forming the related components including the device isolation layer (including isolation layers 102) and the photodiode 120, the PMD can be formed on the first semiconductor substrate 100. Although not shown, a contact (not shown) connected to the transistor circuit (not shown) can be formed in the PMD 101.

A first via 110 can be formed through the PMD 101 and into the first semiconductor substrate 100.

The first via 110 can penetrate the PMD 101 and be formed up to a lower portion of the first semiconductor substrate 100. That is, the first via 110 can be formed as a deep via type.

The first via 110 can be formed at an edge portion of the first semiconductor substrate 100. That is, the first via 110 can be formed at an edge portion of the first semiconductor substrate 100 so that the first via 110 is adjacent to the unit pixel.

In one embodiment, the first via 110 can be formed simultaneously with the contact forming process. It is apparent that the first via 110 can alternatively be formed separately from the contact forming process.

For example, in order to form the first via 110, a photoresist pattern selectively exposing the edge region of the PMD 101 can be formed. Then, a via hole is formed by etching the PMD 101 and the first semiconductor substrate 100 using the photoresist pattern as an etch mask. At this point, the via hole can be formed up to the periphery around a bottom surface region of the first semiconductor substrate 100. A metal layer can be deposited on the PMD 101 to gap-fill the via hole, and then the metal layer can be planarized to form the first via 110.

The first via 110 can be formed of a metal such as, for example, copper (Cu), tungsten (W), or aluminum (Al).

Figure 2:
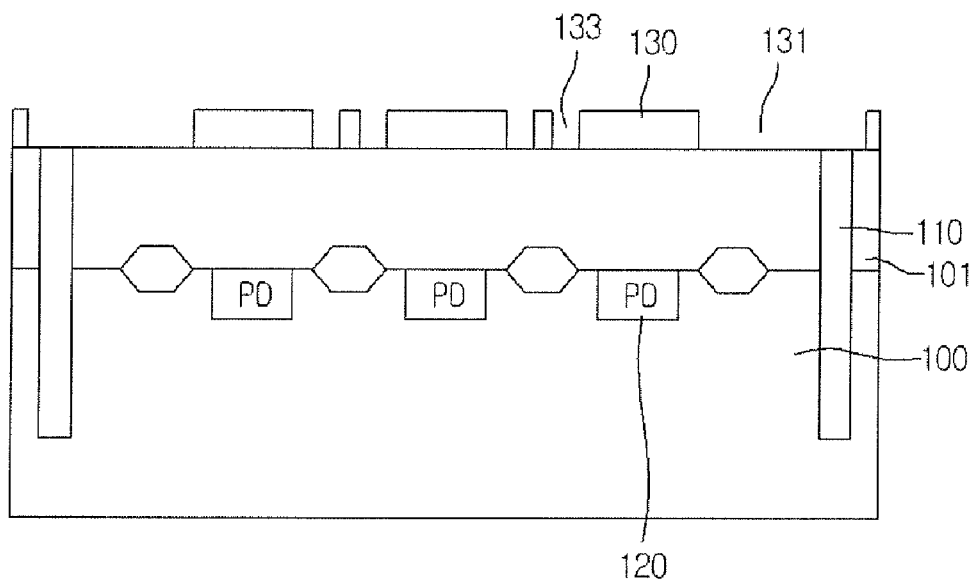

Referring to FIG. 2, a first interlayer dielectric 130 including first and second trenches 131 and 133 can be formed on the PMD 101. The first interlayer dielectric 130 can be formed of, for example, oxide or nitride.

The first trench 131 can be formed to expose the first via 110. The second trench 133 can be formed to selectively expose regions of the PMD 101. Although not shown, the second trench 133 can expose the contact connected to the transistor circuit (not shown).

The first and second trenches 131 and 133 can be formed through a single or dual Damascene process.

Figure 6:
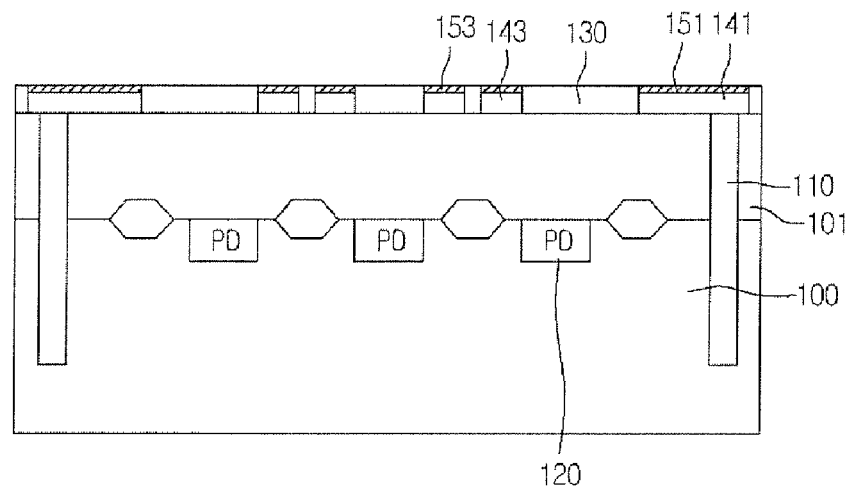

Referring to FIG. 6, first and second metal interconnections 141 and 143 can be formed in the first and second trenches 131 and 133, respectively. The first and second metal interconnections 141 and 143 can be formed by filling the first and second trenches 131 and 133 with interconnection materials. In particular, the first and second metal interconnections 141 and 143 can be formed at locations so as to not block light incident onto the photodiode 120.

In addition, conductive barrier layers 151 and 153 can be formed on the first and second metal interconnections 141 and 143. The conductive barrier layers 151 and 153 can be selectively formed only on the first and second metal interconnections 141 and 143.

As described above, the first interlayer dielectric 130 including the first and second metal interconnections 141 and 143 can be formed in a single layer. The first metal interconnection 141 can be connected to a power line, a signal line, and a circuit region, and the second metal interconnection 143 can be connected to the unit pixel including the photodiode 120. The first metal interconnection 141 can also be connected to a third metal interconnection 221 of the second semiconductor substrate 200 through the first via 110, which will be described later.

According to certain embodiments, the first interlayer dielectric 130 including the first and second metal interconnections 141 and 143 is formed on the pixel region in a single layer and thus a focal length of incident light can be reduced. Therefore, the transmission and condensing rate of light incident onto the photodiode 120 can be improved.

A method for forming the metal interconnection will now be described in detail with reference to FIGS. 3 to 5. The shape of the trench of FIG. 5 is illustrated for explaining the method for forming the metal interconnection and should not be construed as limiting. The trench may be formed in various shapes through a single or dual Damascene process. The metal interconnection illustrated in FIGS. 3 to 5 can be the first or second metal interconnection. In the below description, the metal interconnection illustrated in FIGS. 3 to 5 is the second metal interconnection 143.

Figure 3:

Referring to FIG. 3, a trench exposing a contact 125 connected to the unit pixel is formed to penetrate the first interlayer dielectric 130. In one embodiment, in order to form the second metal interconnection 143 in the trench, a copper plating layer 140 is formed by depositing copper (Cu) using an electroplating process.

Figure 4:
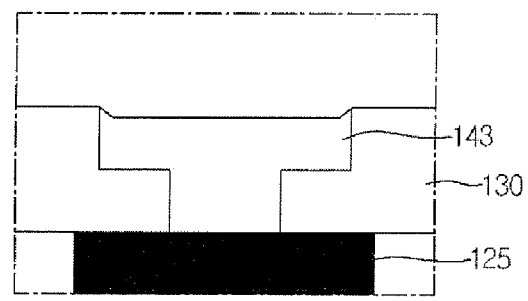
Figure 5:
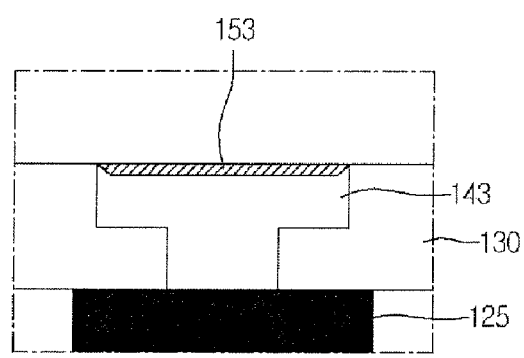

Referring to FIG. 4, a planarization process is performed on the copper plating layer 140 to form the second metal interconnection 143. The copper plating layer 140 can be planarized using a chemical mechanical polishing (CMP) process.

Although not shown, before depositing the copper plating layer 140, a metal barrier layer can be formed within the trench in order to inhibit the diffusion of copper, and a copper seed layer can be formed within the trench in order to facilitate the deposition of copper. In certain embodiments, the metal barrier layer (not shown) can be formed of any one of tantalum (Ta), tantalum nitride (TaN), tantalum silicon nitride (TaSiN), and titanium silicon nitride (TiSiN) using a physical vapor deposition (PVD) process, a chemical vapor deposition (CVD) process, or an atomic layer deposition (ALD) process. In addition, the copper seed layer can be formed of copper using a PVD process, a CVD process, or an ALD process.

The first interlayer dielectric 130 can be used as an etch stop layer during the planarization process of the copper plating layer 140. At this point, the copper plating layer 140 formed in the trench can be polished more excessively than the first interlayer dielectric 130 through the control of the CMP process. That is, the CMP process may be performed such that the first interlayer dielectric 130 and the second metal interconnection 143 formed of copper have a height difference.

In this way, the copper plating layer 140 is excessively polished through the control of the CMP process, and the second metal interconnection 143 can be formed lower than the first interlayer dielectric 130. In particular, since a dishing phenomenon occurs in the second metal interconnection 143 due to the CMP process, it is possible to inhibit the occurrence of a short or leakage current on an adjacent metal interconnection in a subsequent process of depositing the connective barrier layer 153. In one embodiment, the second metal interconnection 143 formed in the trench and the first interlayer dielectric 130 can have a height difference in the range from about 10 Å to about 500 Å.

Referring to FIG. 5, a conductive barrier layer 153 can be formed on only the second metal interconnection 143. The conductive barrier layer 153 can inhibit the copper diffusion of the second metal interconnection 143 formed of copper. For example, the conductive barrier layer 153 can be formed of cobalt (Co) or nickel (Ni) alloy. In one embodiment, the conductive barrier layer 153 can be formed by performing an electroless plating process. In addition, the conductive barrier layer 153 can be formed to have a thickness ranging from about 10 Å to about 1,000 Å.

The conductive barrier layer 153 can be selectively formed on only the metal interconnection 143 using the electroless plating process. In such an embodiment, the conductive barrier layer 153 is not formed on the first interlayer dielectric 130. Since the conductive barrier layer 153 is not formed over the photodiode, light refraction or reflection due to the conductive barrier layer 153 does not occur. Thus, the light transmission of the photodiode 120 can be improved.

Figure 7:
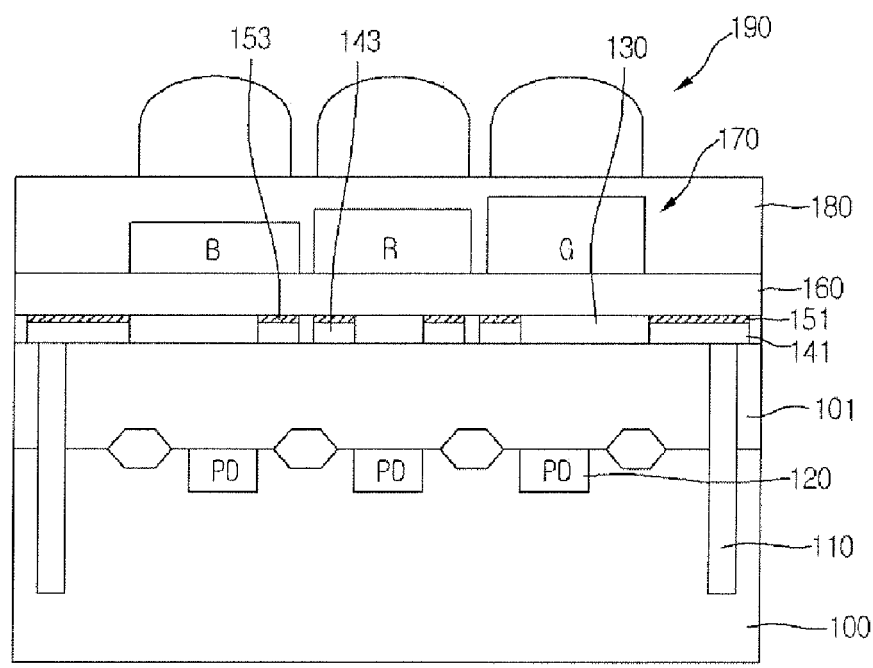

Referring to FIG. 7, a passivation layer 160 for protecting components can be formed on the first interlayer dielectric 130. The passivation layer 160 can protect components such as the first and second metal interconnections 141 and 143 and the conductive barrier layers 151 and 153.

A color filter array 170 can be formed on the passivation layer 160 in order to implement a color image. The color filter array 170 can include a red color filter R, a green color filter G, and a blue color filter B, which can be formed using dyed photoresist. The color filter array 170 can be formed in each unit pixel and separates colors from incident light.

A planarization layer 180 can be formed on the color filter array 170. Since the color filter array 170 generally has a height difference, the planarization player 180 is formed for removing or reducing the height difference caused by the color filter, so that a microlens 190, which may be formed in a subsequent process, can be formed on the planarized surface.

Thereafter, a microlens 190 can be formed on the planarization layer 180 in order to condense light.

Referring to FIG. 8, a second semiconductor substrate 200 can be provided on the backside of the first semiconductor substrate 100 including the microlens 190.

In order to form the second semiconductor substrate 200 on the backside of the first semiconductor substrate 100, a capping layer (not shown) can be formed for protecting the surface of the microlens 190. Thereafter, a back grinding process can be performed to expose the first via 110 of the first semiconductor substrate 100.

The back grinding process is a process to expose the first via 110 by etching the backside of the first semiconductor substrate 100. For example, the first via 110 can be exposed by etching the backside of the first semiconductor substrate 100 by about 10-50 μm.

The second semiconductor substrate 200, which will be connected to the first semiconductor substrate 100, is separately prepared. The second semiconductor substrate 200 is used to form the metal interconnections connected to a power line and an external signal line.

To achieve such connections, the second semiconductor substrate 200 can include a plurality of interlayer dielectrics 210 and 220 and a plurality of metal interconnections 211 and 221.

The second semiconductor substrate 200 can be a monocrystalline silicon substrate or a polycrystalline silicon substrate.

A second interlayer dielectric 210 can be formed on the second semiconductor substrate 200, and a plurality of metal interconnections 211 can be formed in the second interlayer dielectric 210. A third interlayer dielectric 220 can be formed on the second interlayer dielectric 210, and a plurality of metal interconnections 221 can be formed in the third interlayer dielectric 220. Although not shown, the metal interconnections 211 of the second interlayer dielectric 210 can be connected to the metal interconnections 221 of the third interlayer dielectric 220.

In the following description, the metal interconnections formed in the third interlayer dielectric 220 of the second semiconductor substrate 200 are referred to as third metal interconnections 221.

In order to form a second via 230 in the third interlayer dielectric 220, a via hole (not shown) can be formed to expose the surface of a third metal interconnection 221 of the third interlayer dielectric 220. The second via 230 can be formed by gap-filling the via hole with a metal material. The second via 230 is exposed to the surface of the second semiconductor substrate 200. At this point, the second via 230 can be formed at a location corresponding to the first via 110 of the first semiconductor substrate 100. The second via 230 can be formed of a metal including, for example, copper (Cu), tungsten (W), or aluminum (Al).

The second semiconductor substrate 200 is placed under the first semiconductor substrate 100 and a bonding process can be performed thereon. At this point, the first via 110 exposed to the backside of the first semiconductor substrate 100 is aligned with the second via 230 exposed to the top surface of the second semiconductor substrate 200 and the bonding process is performed thereon.

The first via 110 and the second via 230 are electrically bonded and connected to each other, and the first semiconductor substrate 100 is electrically connected to the second semiconductor substrate 200.

In an embodiment, the first semiconductor substrate 100 and the second semiconductor substrate 200 can be electrically connected to each other using polymer such as polyimide or benzocyclobutene.

In addition, the first semiconductor substrate 100 and the second semiconductor substrate 200 can be bonded together by a silicon fusion bonding, a copper-to-copper bonding, or an eutectic bonding using eutectic alloy such SnCu.

According to embodiments, the method for fabricating the image sensor can maximize the light transmission of the photodiode by selectively forming the conductive barrier layer only on the metal interconnection.

In addition, according to embodiments, the copper diffusion to the interface of the interlayer dielectric is inhibited by selectively forming the conductive barrier layer only on the metal interconnection, thereby improving electromigration (EM) characteristic.

Furthermore, according to embodiments, the metal interconnection can be formed lower than the interlayer dielectric through the control of the CMP process for forming the metal interconnection, thereby increasing the selective deposition rate on only the metal interconnection during the process of depositing the conductive barrier layer.

Moreover, according to embodiments, the focus length of the microlens can be shortened because the metal interconnection for connection to the pixel region is formed above the pixel region and the other metal interconnections are disposed under the pixel region. Hence, the light transmission of the photodiode can be maximized.

Any reference in this specification to "one embodiment," "an embodiment," "exemplary embodiment," etc., means that a particular feature, structure, or characteristic described in connection with the embodiment is included in at least one embodiment of the disclosure. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with others of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An image sensor, comprising:
    a second semiconductor substrate including a second metal interconnection and a second interlayer dielectric;
    a second via penetrating the second interlayer dielectric so that the second via is connected to the second metal interconnection;
    a first semiconductor substrate on the second interlayer dielectric, the first semiconductor substrate having a unit pixel;
    a pre-metal dielectric on the first semiconductor substrate;
    a first via penetrating the pre-metal dielectric and the first semiconductor substrate, the first via being connected to the second via;
    a first interlayer dielectric on the pre-metal dielectric including the first via;
    a first metal interconnection on the first interlayer dielectric and connected to the first via and the unit pixel;
    a conductive barrier layer on the first metal interconnection; and
    a color filter and a microlens on the first interlayer dielectric on the unit pixel.

2. The image sensor according to claim 1, wherein the first metal interconnection comprises copper (Cu).

3. The image sensor according to claim 1, wherein the conductive barrier layer comprises cobalt (Co) or nickel (Ni) alloy.

4. The image sensor according to claim 1, wherein the first metal interconnection has a top surface lower than that of the first interlayer dielectric, such that the first metal interconnection and the first interlayer dielectric have a height difference.

5. The image sensor according to claim 1, wherein the second metal interconnection comprises copper (Cu) or aluminum (Al).

6. The image sensor according to claim 1, wherein the conductive barrier layer has at top surface substantially even with the top surface of the first interlayer dielectric.

7. The image sensor according to claim 1, wherein the first via and the second via comprise the same material.

8. The image sensor according to claim 1, wherein the second semiconductor substrate provides metal interconnections for connection to a power line and an external signal line.

9. A method for fabricating an image sensor, the method comprising:
    forming a pre-metal dielectric on a first semiconductor substrate including a unit pixel;
    forming a first via penetrating the pre-metal dielectric and at least a portion of the first semiconductor substrate corresponding to a non unit-pixel region;
    forming a first interlayer dielectric on the first semiconductor substrate including the first via;
    forming a first metal interconnection on the first interlayer dielectric such that the first metal interconnection is connected to the unit pixel and the first via;
    forming a conductive barrier layer on the first metal interconnection;
    forming a color filter and a microlens on the first interlayer dielectric for the unit pixel;
    preparing a second semiconductor substrate including a second metal interconnection and a second interlayer dielectric;
    forming a second via penetrating the second interlayer dielectric, such that the second via is connected to the second metal interconnection; and
    bonding the first via of the first semiconductor substrate with the second via of the second semiconductor substrate.

10. The method according to claim 9, wherein the forming of the first metal interconnection comprises:
    forming a trench in the first interlayer dielectric;
    forming a copper plating layer in the trench; and
    planarizing the copper plating layer.

11. The method according to claim 10, wherein the planarizing of the copper plating layer comprises performing a chemical mechanical polishing process until a height difference between the top surface of the first metal interconnection and the top surface of the first interlayer dielectric is established.

12. The method according to claim 9, wherein the first metal interconnection is formed such that the first metal interconnection and the interlayer dielectric have a height difference.

13. The method according to claim 12, wherein the forming of the conductive barrier layer comprises forming the conductive barrier layer on only the first metal interconnection and removing the height difference.

14. The method according to claim 9, wherein the forming of the conductive barrier layer comprises performing an electroless plating process.

15. The method according to claim 14, wherein the etching of the backside of the first semiconductor substrate comprises performing a back grinding process to remove a thickness of about 10-50 μm from the backside of the first semiconductor substrate.

16. The method according to claim 9, wherein the conductive barrier layer comprises cobalt (Co) or nickel (Ni) alloy.

17. The method according to claim 9, wherein the second metal interconnection comprises copper (Cu) or aluminum (Al).

18. The method according to claim 9, wherein the bonding of the first via of the first semiconductor substrate with the second via of the second semiconductor substrate comprises:

etching a backside of the first semiconductor substrate to expose the first via;

forming a via hole exposing the metal interconnection of the second semiconductor substrate, and depositing a metal layer in the via hole to form a second via; and aligning the first via and the second via, and performing a process of bonding the first semiconductor substrate with the second semiconductor substrate.

19. The method according to claim 9, wherein the bonding of the first via of the first semiconductor substrate with the second via of the second semiconductor substrate comprises bonding the first semiconductor substrate and the second semiconductor substrate together by performing a polymer bonding, a silicon fusion bonding, a copper-to-copper bonding, or an eutectic bonding.

20. The method according to claim 9, wherein the first via and the second via are formed of the same material.

* * * * *